United States Patent
Takahashi et al.

(10) Patent No.: US 6,497,354 B2
(45) Date of Patent: Dec. 24, 2002

(54) BONDING APPARATUS AND BONDING TOOL FOR COMPONENT

(75) Inventors: Seiji Takahashi, Fukuoka (JP); Kenichi Otake, Fukuoka (JP); Takatoshi Ishikawa, Fukuoka (JP); Makoto Okazaki, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/899,356

(22) Filed: Jul. 5, 2001

(65) Prior Publication Data
US 2002/0066767 A1 Jun. 6, 2002

(30) Foreign Application Priority Data
Jul. 6, 2000 (JP) ........................................ 2000-204643

(51) Int. Cl.[7] ............................... B23K 1/06; B23K 5/20
(52) U.S. Cl. ........................ 228/1.1; 228/4.1; 228/110.1
(58) Field of Search ........................... 228/4.1, 1.1, 110.1

(56) References Cited

U.S. PATENT DOCUMENTS 3,923,584 A * 12/1975 Hojo et al. ................ 156/379
5,884,831 A    3/1999 Sato et al.
6,202,915 B1 * 3/2001 Sato ........................... 156/73.1
6,247,628 B1 * 6/2001 Sato et al. ................... 228/1.1

FOREIGN PATENT DOCUMENTS

| JP | 10-22308  | 1/1998 |
| JP | 10-52768  | 2/1998 |
| JP | 2915350   | 4/1999 |

* cited by examiner

Primary Examiner—Tom Dunn
Assistant Examiner—Zidia Pittman
(74) Attorney, Agent, or Firm—RatnerPrestia

(57) ABSTRACT

In a bonding tool which bonds a component to a substrate by urging and vibration, a through hole is formed in the horn. An adhesion section is fit into a lower section of the hole and an engaging section is fit into an upper section of the hole, so that a sealed inner space is formed inside the hole by tightening an outer screw. An adhesion hole open to a bonding section communicates with a sucking hole of the horn via the inner space, so that a simply structured vacuum-adhesion-system can be formed. These mechanics do not lose replaceablility of the adhesion section detachable to the horn. As a result, the adhesion section can be replaceable as an independent part (urging terminal), and a bonding apparatus as well as a bonding tool having the simply structured vacuum-adhesion-system can be provided.

20 Claims, 11 Drawing Sheets

BONDING APPARATUS AND BONDING TOOL FOR COMPONENT

FIELD OF THE INVENTION

The present invention relates to a bonding apparatus for bonding an electronic component such as a semiconductor with a bump, e.g., a flip-chip, to a surface such as an electrode of a substrate, and it relates also to a bonding tool.

BACKGROUND OF THE INVENTION

An ultrasonic bonding method has been known as one of the bonding methods for bonding an electronic component to a surface such as an electrode of a substrate. This method urges a component to the surface and also gives the component ultrasonic vibration, so that the bonding surface of the component is finely vibrated. Thus friction is generated between the bonding surface of the component and the surface of the substrate, thereby solidly affixing the bonding surface of the component onto the surface of the substrate.

A bonding tool used in this method has a horn-shaping in a rod-for transmitting the vibration of a ultrasonic vibrator, a source of vibration, to the component. The horn is equipped with an urging terminal, which applies load and vibration to the component, thereby bonding the component to the surface of the substrate.

The load and vibration are applied to the urging terminal at bonding, and repeated use of the terminal tends to wear out the lower face (the face sucking a component) of the terminal. When the terminal is seriously worn out, a normal bonding cannot be expected. Thus the urging terminal should be replaced periodically. At the replacing, it is generally avoided replacing the entire horn, and only an urging terminal is replaced because the urging terminal is designed to be detachable from the horn.

The bonding tool discussed above is often used as a moving tool for moving a component and mounting it onto a substrate. In the bonding tool having such a moving function, an adhesion hole for vacuum adhesion is provided at a bonding section contacting with a component, and the component is adhered to and retained by this adhesion hole via a vacuum suction hole provided inside the horn However, the bonding tool having the urging terminal as an independ part has a difficulty in a structure for both the adhesion hole at the bonding section and the suction hole inside the horn to communicate with each other. Thus a method for building a vacuum adhesion system in a simple structure has been demanded.

SUMMARY OF THE INVENTION

A bonding tool for bonding a component, comprises
a horn having a suction passage;
a vibrator for vibrating the horn; and
an outer screw having a further suction passage. The outer screw is at least partially situated within the horn so that an inner space is defined 1) between the outer screw and the horn; and 2) at least one of above and below the suction passage. Suction supplied by the source of suction flows through the suction passage, the further suction passage and inner space for picking up the component.

DETAILED DESCRIPTION OF THE INVENTION

A bonding tool comprises the following elements:
(a) a vibrator;
(b) a horn including a suction passage, receiving vibration from the vibrator, and having a through hole at a place corresponding to an antinode of standing wave, the through hole being orthogonal to a longitudinal direction of the horn;
(c) an outer screw;
(d) an urging terminal for being fit to the horn by the outer screw so that a first end of the through-hole is sealed, the terminal having a bonding section-to be contact with a component-on its tip, and including an adhesive hole open to the bonding section and communicating with an inner space formed by sealing a second end and the first end of the through hole with a coupling member and the urging terminal by itself respectively; and
(e) a coupling member for being fit to the horn thereby sealing the second end of the through hole, and being coupled to the urging terminal by fastening means via the through hole.

The bonding tool vacuum-sucks the inner space via the sucking hole, and bonds a component to the surface of a substrate by applying pressure and vibration to the component.

This structure allows the inner space to be formed by sealing the second and first ends of the through hole with the coupling member and the urging terminal. An adhesion hole open to the bonding section of the urging terminal communicates with a vacuum sucking hole provided to the horn via the inner space, so that a vacuum sucking system in a simple structure can be formed without loosing detachability of the adhesion section.

Exemplary embodiments of the present invention are demonstrated hereinafter with reference to the accompanying drawings:

FIRST EXEMPLARY EMBODIMENT

Figure 1:
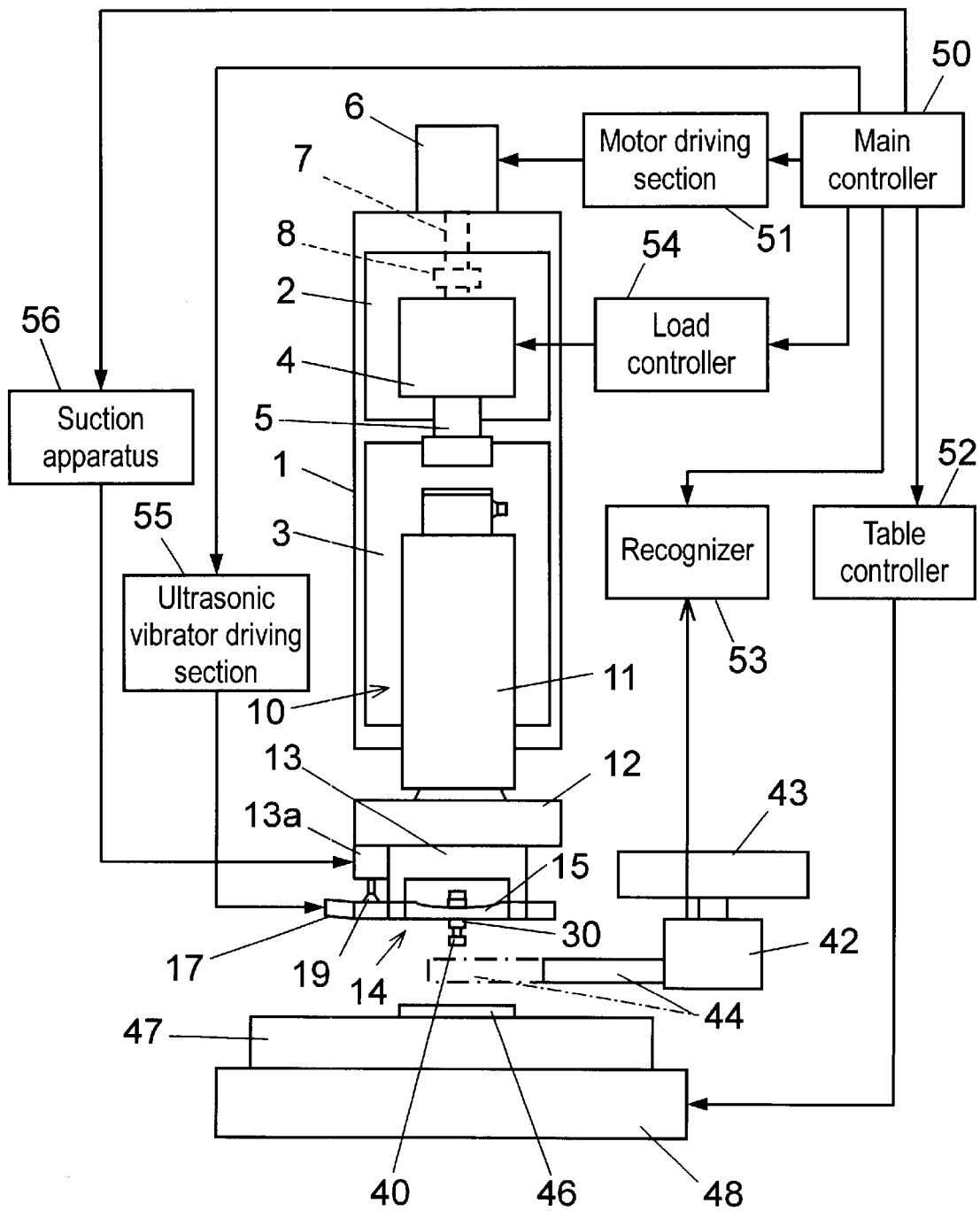
FIG. 1 shows a structure of a bonding apparatus in accordance with a first exemplary embodiment of the present invention.
Figure 2:
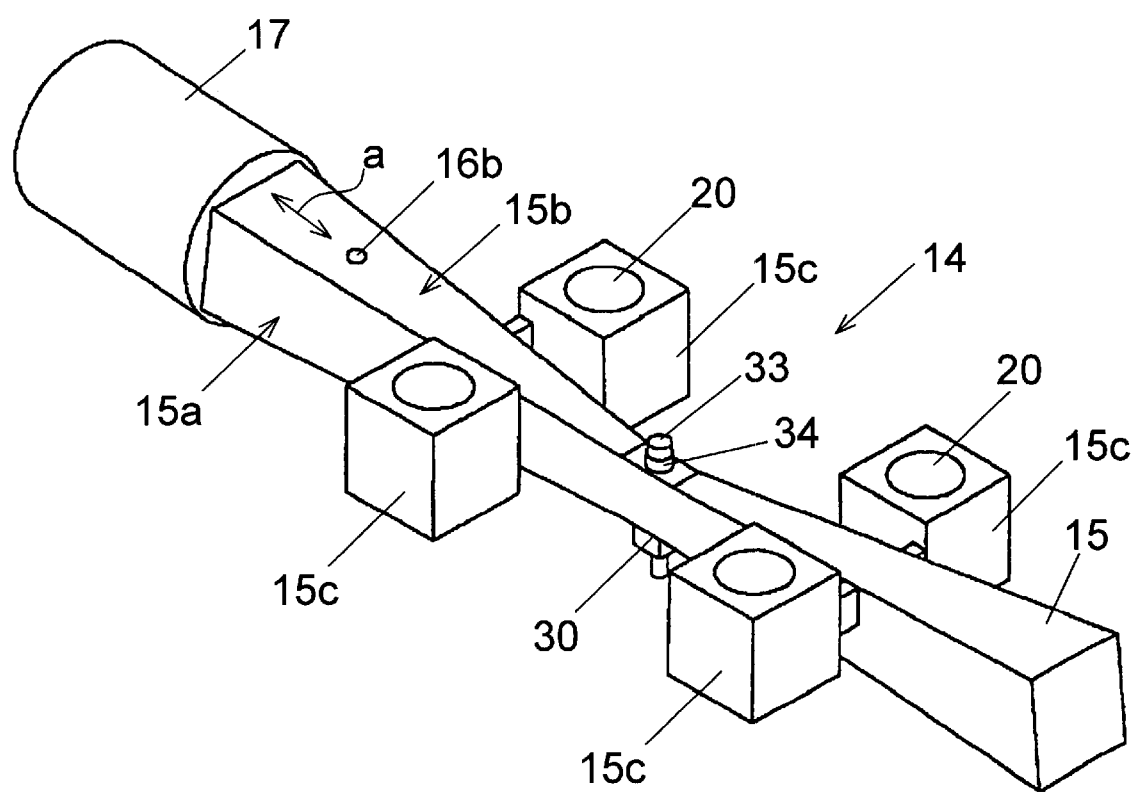
FIG. 2 is a perspective view of a bonding tool of the bonding apparatus shown in FIG. 1.
Figure 3A:
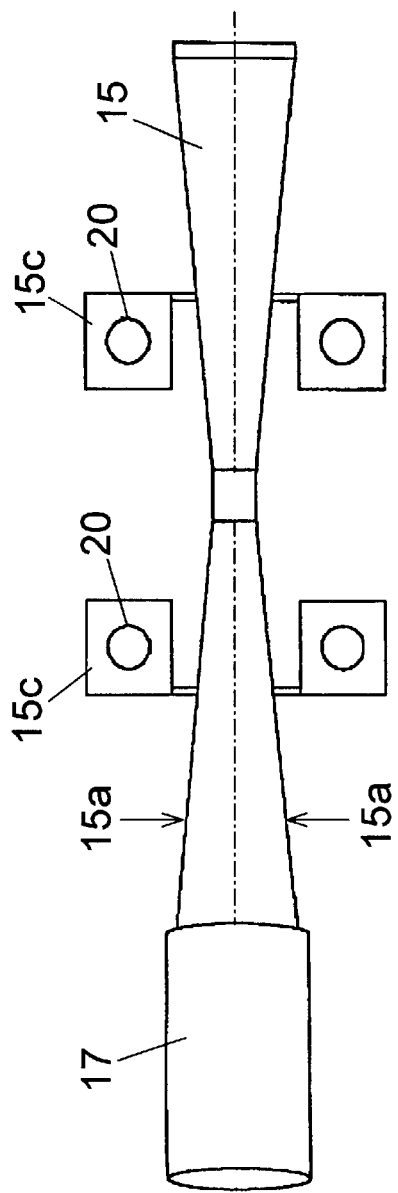
FIG. 3A is a plan view of the bonding tool of the bonding apparatus shown in FIG. 1.
Figure 3B:
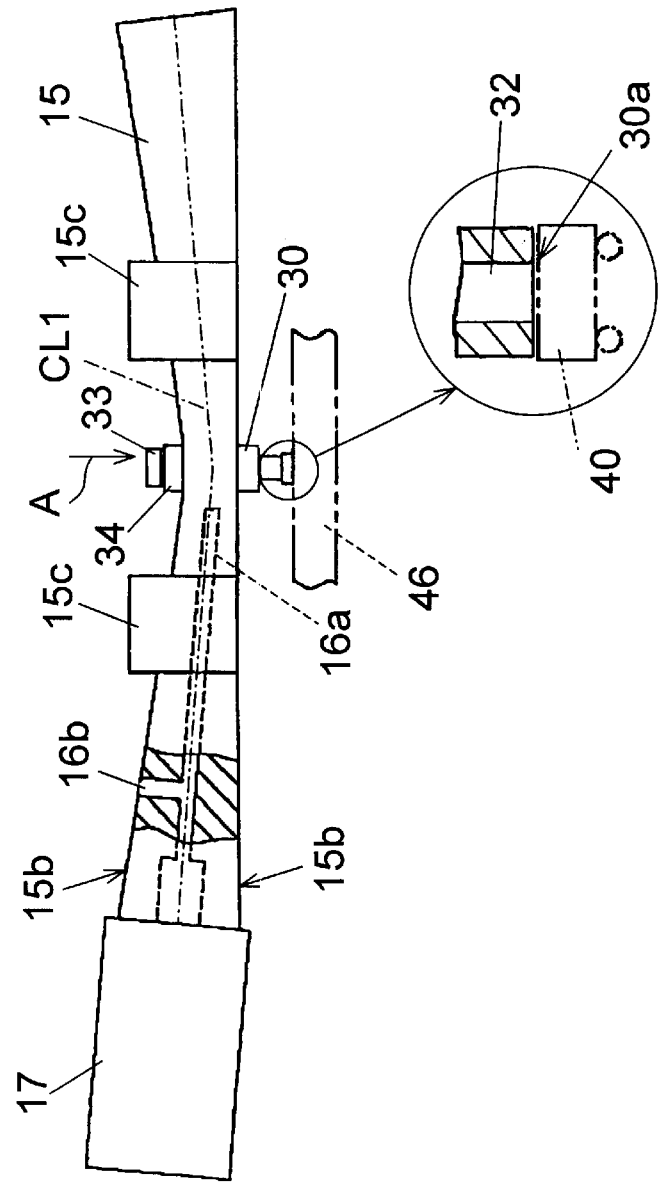
FIG. 3B is a front view of what is shown in FIG. 3A.
Figure 4:
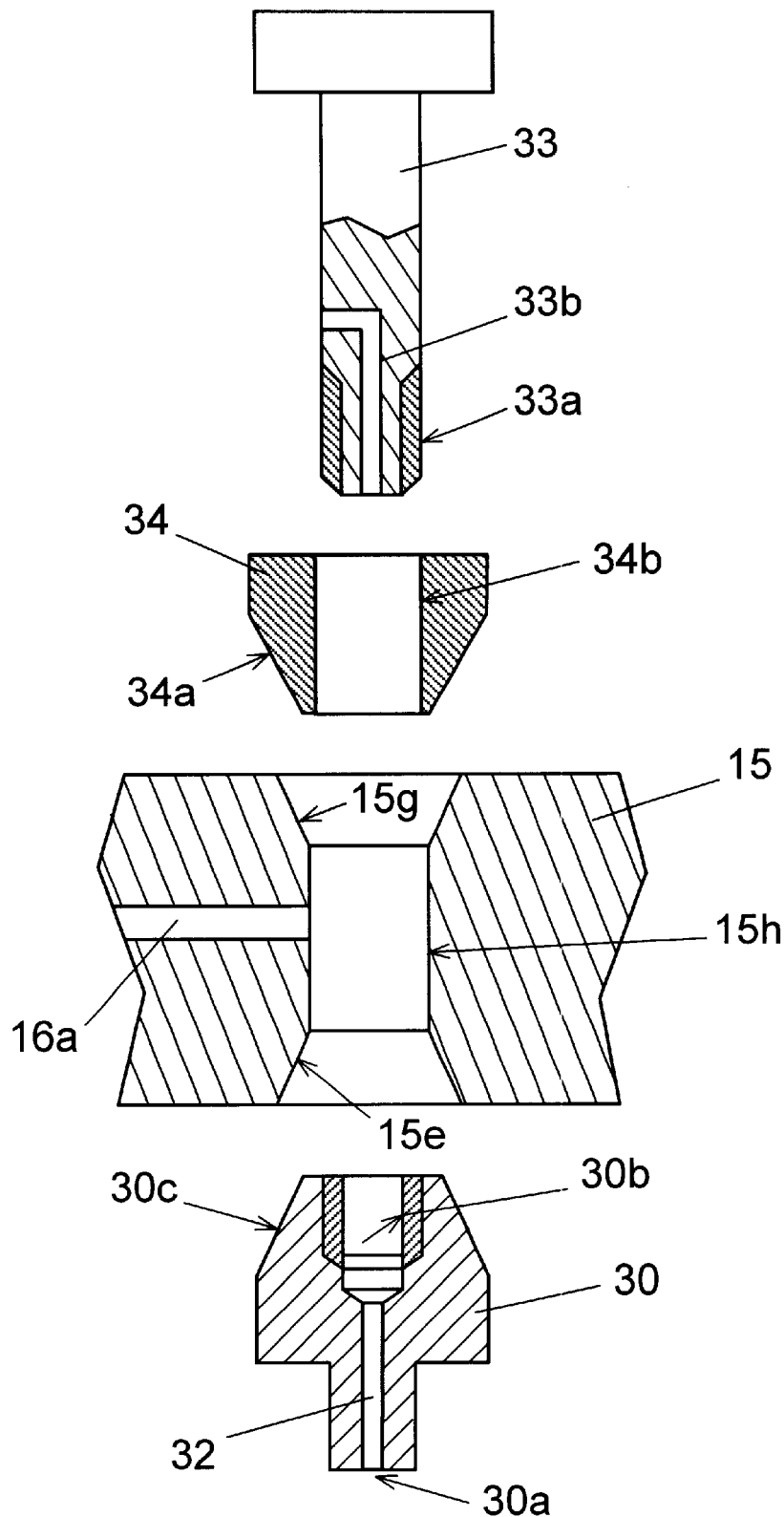
FIG. 4 and FIG. 5 are partial cross sectional views of the bonding tool shown in FIG. 1.
Figure 5:
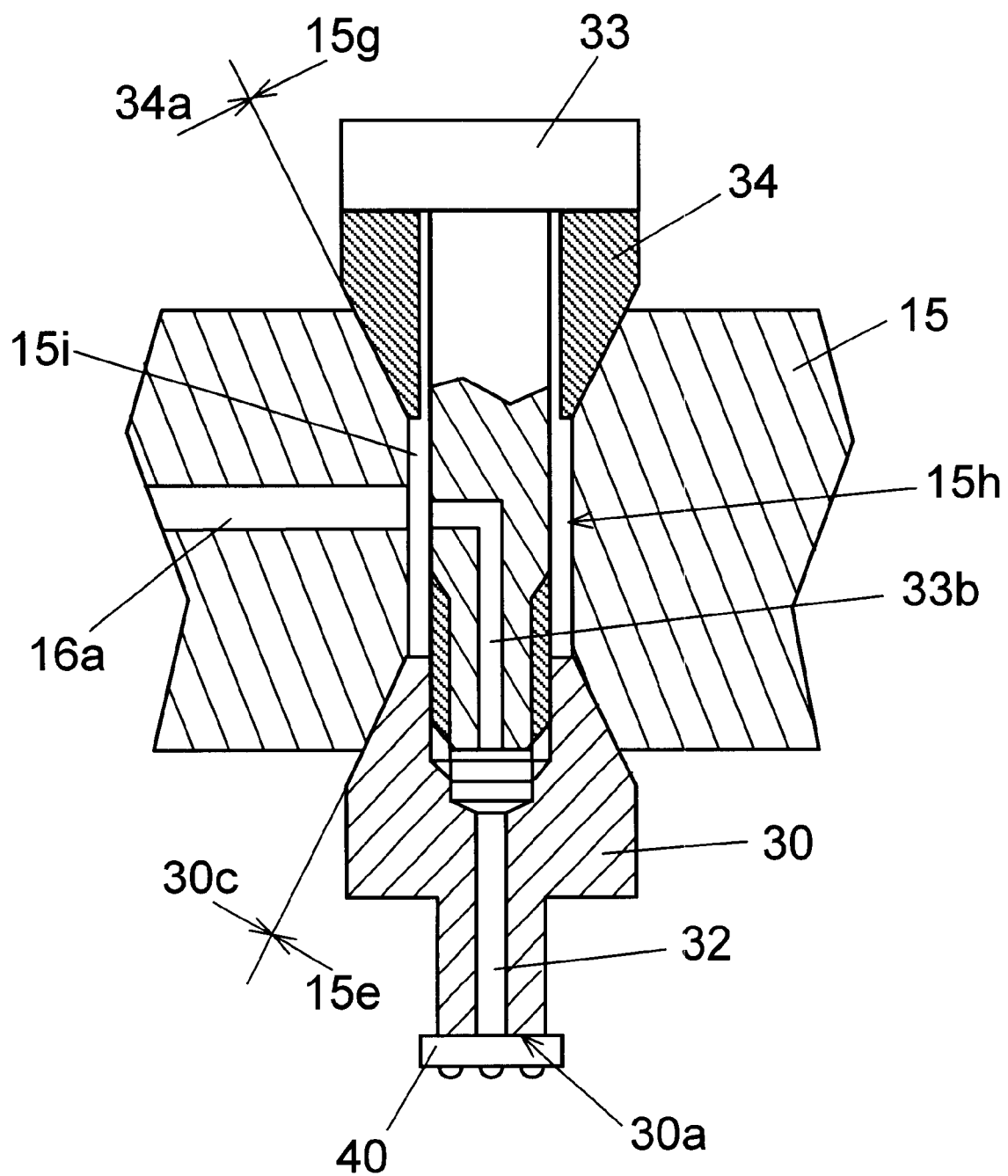

FIG. 1 shows a structure of a bonding apparatus in accordance with the first exemplary embodiment. FIG. 2 is a perspective view of a bonding tool of the bonding apparatus shown in FIG. 1. FIG. 3A and FIG. 3B are a plan view and a front view of the bonding tool of the bonding apparatus shown in FIG. 1. FIG. 4 and FIG. 5 are partial cross sectional views of the bonding tool of the bonding apparatus shown in FIG. 1.

An entire structure of the bonding apparatus is described with reference to FIG. 1. In FIG. 1, first lift plate 2 and second lift plate 3 are disposed in front of support frame 1. Cylinder 4 is mounted to lift plate 2, and rod 5 of cylinder 4 is coupled to lift plate 3. Bonding head 10 is provided to lift plate 3. Motor 6 on Z-axis is provided on top of frame 1. Motor 6 rotates vertical feed-screw 7 which is engaged with nut 8 provided to the backside of lift plate 2. Thus when motor 6 drives feed screw 7, nut 8 ups and downs along feed screw 7, and lift plate 2 as well as lift plate 3 also ups and downs.

In FIG. 1, the top surface of substrate 46 is to be bonded to a component. Substrate 46 is placed on substrate holder 47, which is placed on table 48. Table 48 is movable, and moves substrate 46 in X direction or Y direction (orthogonal with each other, and perpendicular to Z axis) and positions substrate 46 at a given place. In other words, table 48 functions as positioning means to move substrate 46 relatively to component 40.

Camera 42 is mounted to unidirectional table 43. Lens-barrel 44 extends forward out of camera 42. Forward camera 42 along unidirectional table 43 and position the tip of lens-barrel 44-as shown with a chain line-between substrate 46 and component 40 which is adhered to the lower face of bonding tool 14. Then monitor the positions of component 40 and substrate 46 with camera 42. Component 40 adhered to the lower face of bonding tool 14 is, e.g., an electronic component with a bump, to be bonded to substrate 46.

Recognizer 53 recognizes images of component 40 and substrate 46 shot by camera 42, and detects their positions. Main controller 50 controls motor 6 via motor driving section 51, namely it controls up and down of head 10. Main controller 50 also positions table 48 via table controller 52, namely controller 50 positions substrate 46. At this time, main controller 50 calculates a positional shift between component 40 and substrate 46 in the horizontal plane based on a positional relation between them detected by recognizer 53. Then controller 50 drives table 48 so that the positional shift can be corrected. Controller 50 is further coupled to load controller 54 and sucking apparatus 56.

Cylinder 4, as urging means, is coupled to main controller 50 via load controller 54, so that protruding force of rod 5 of cylinder 4, i.e., urging load by bonding tool 14 to the bump of component 40 against substrate 46, is controlled. Sucking apparatus 56 makes bonding tool 14 suck component 40 or release sucking according to an instruction from controller 50. Vibrator 17 is coupled to controller 50 via ultrasonic-vibrator-driver 55, and generates ultrasonic vibration according to an instruction from controller 50.

Holder 12 is coupled to the lower end of head block 11 including head 10. Block 13 is mounted to holder 12. Bonding tool 14 is rigidly mounted to block 13. Protrusion 13a on a side of block 13 is coupled to sucking apparatus 56, and adhesion pad 19 is provided to protrusion 13a.

Next, bonding tool 14 is detailed with reference to FIG. 2, FIG. 3A and FIG. 3B. As shown in these drawings, bonding tool 14 mainly comprises horn 15 with more frontage than depth. Horn 15 shapes in a long and narrow rod, and has a tapered face 15a narrowing from both the ends toward the center thereof. At the center of horn 15, adhesion section 30 (urging terminal) is detachably mounted and protrudes downwardly.

Sucking holes 16a, 16b-communicating with adhesion hole 32 of adhesion section 30 (urging terminal)-are formed on horn 15. Adhesion pad 19 shown in FIG. 1 adheres to sucking hole 16b open to upper face of horn 15. Thus sucking apparatus 56 shown in FIG. 1 and coupled to adhesion pad 19 is driven for sucking air, so that vacuum sucking through adhesion hole 32 shown in FIG. 3B is done for component 40 to adhere to the lower face of adhesion section 30.

The lower section of adhesion section 30 functions as bonding section 30a, which applies bending vibration of adhesion section 30 as well as urging load of cylinder 4 (urging means) to component 40. Component 40 adheres to adhesion section 30, which retains component 40. At bonding, bonding section 30a is brought contact with the upper face of component 40, and urges component 40 against substrate 46. Ribs 15c are provided at four places away from adhesion section 30 with an equal space so that ribs 15c are integrally formed with horn 15. These four ribs 15c are symmetrically placed with respect to adhesion section 30 viewed from the above in order to keep balance at mounting the bonding tool to block 13. Bonding tool 14 is mounted detachably to the lower face of block 13 by screwing bolts into respective through holes 20 formed in each rib 15c.

In FIG. 2, on one end of horn 15, vibrator 17 is mounted as vibration giving means. Driving vibrator 17 gives horn 15 vertical vibration (vibration in a longitudinal direction of horn 15), so that adhesion section 30 vibrates in a horizontal direction, namely, direction "a" shown in FIG. 2 (longitudinal direction of horn 15.) As shown in FIG. 3A and FIG. 3B, the shape of horn 15 tapers from both the ends to the center, and thus the height and the width are gradually narrowed on side face 15a and upper and lower faces 15b. This shape allows the ultrasonic vibration to be amplified through the transmitting path from vibrator 17 to adhesion section 30, which thus receives vibration having amplitude greater than the amplitude generated by vibrator 17. This vibration is transmitted to component 40 via bonding section 30a. In this transmission, the vibration induced at protruded adhesion section 30 is superimposed with the vibration transmitted through horn 15.

Mounting of adhesion section 30 to horn 15 is detailed with reference to FIG. 4 and FIG. 5. As shown in FIG. 4, vertical through hole 15h is provided at the center of horn 15. More particularly, hole 15h is provided at a place corresponding to the antinode of the standing wave induced on horn 15 by vibrator 17 and the hole is formed orthogonal to the longitudinal direction of horn 15. In the upper and lower sections of hole 15h, inner tapered section 15g and 15e are provided.

On the upper surface, of adhesion section 30, inner screw section 30b is provided, of which outer wall forms outer tapered section 30c corresponding to inner tapered section 15e. Engaging member 34 has outer tapered section 34a corresponding to inner tapered section 15e. Through inner hole 34b of engaging member 34, outer screw 33 travels. At the lower end of outer screw 33, outer screw section 33a is provided and to be engaged with inner screw section 30b of adhesion section 30. Inside of outer screw 33, sucking hole 33b is formed, the hole being open to side-wall in the middle section and communicating with the lower end of outer screw 33.

When adhesion section 30 is coupled to horn 15, as shown in FIG. 5, outer tapered section 30c of adhesion section 30 is fit into inner tapered section 15e of the horn, and outer tapered section 34a of engaging member 34 is fit into inner tapered section 15g of the horn. Then outer screw 33 is extended through inner hole 34b of engaging member 34 and through hole 15h of horn 15, and outer screw section 33a is engaged with inner screw section 30b of adhesion section 30 and tightened. Thus outer tapered section 30c of adhesion section 30 is urged against tapered section 15e of horn 15 by outer screw 33, and fastened to horn 15.

In this fastening by outer screw 33, outer tapered section 34a of engaging member 34 is fastened while it is urged to inner tapered section 15g of horn 15. Therefore, engaging member 34 and outer screw 33 function as coupling members to adhesion section 30 through hole 15h of horn 15, and outer screw section 33a and inner screw section 30b function as fastening means for coupling adhesion section 30 to engaging member 34.

When adhesion section 30 and engaging member 34 are fastened to horn 15, the lower section of through hole 15h is sealed by adhesion section 30, and the upper section of hole 15h is sealed by engaging section 34 together with outer screw 33. Thus inner space 15i is formed in through hole 15h, and the space's upper and lower ends are sealed. Sucking hole 16a is open to inner space 15i, and vacuum suction from hole 16a has inner space 15i vacuum-sucked. When outer screw 33 is mated with inner screw section 30b of adhesion section 30, sucking hole 33b communicates with adhesion hole 32 open to bonding section 30a of adhesion section 30. Thus adhesion hole 32 communicates with inner space 15i via sucking hole 33b.

In this fastened status, sucking hole 16a provided to horn 15 communicates with adhesion hole 32 via inner space 15i. Thus delicate adjustment is not necessary for positioning the two sucking holes to coincide with each other in the vacuum sucking system which makes horn 15 communicate with adhesion section 30 detachably mounted to horn 15, because the two sucking holes, 16a and 33b are formed on the separate parts. As a result, this structure can furnish more freedom for positioning the sucking holes.

Since the fastening mechanics discussed above is employed in this bonding tool, the following advantages can be produced.

First, in this fastening mechanics, adhesion section 30 is pulled up from the above of horn 15 by outer screw 33 which extends through hole 15h, so that outer tapered section 34a of engaging member 34 is urged against inner tapered section 15g of horn 15. Therefore, there is no need to prepare parts for fastening to horn 15 around adhesion section 30, thereby furnishing more freedom to a shape of adhesion section 30 and positions of sucking holes. As a result, adhesion section 30, more adaptive to components to be bonded and vibration characteristics required, can be realized, and adhesion section 30 is urged against horn 15 with enough pressure, thereby realizing stable fitting status. When the vibration in the longitudinal direction of horn 15 is applied to this fitting section of adhesion section 30, horizontal displacements of these fastening members are restricted, thereby realizing a tough fitting.

Further, if the shapes and dimensions of sections of engaging member 34 and outer screw 33-both the sections protruded to upper side of horn 15-are designed properly for the shape and dimensions of adhesion section 30, the mass distribution in a vertical direction of horn 15 can be adjusted to a desirable mass-distribution for vibration-transmission-characteristics. In other words, engaging member 34 and outer screw 33 can be utilized as mass balancing sections, so that better vibration characteristics is obtainable.

SECOND EXEMPLARY EMBODIMENT

Figure 6:
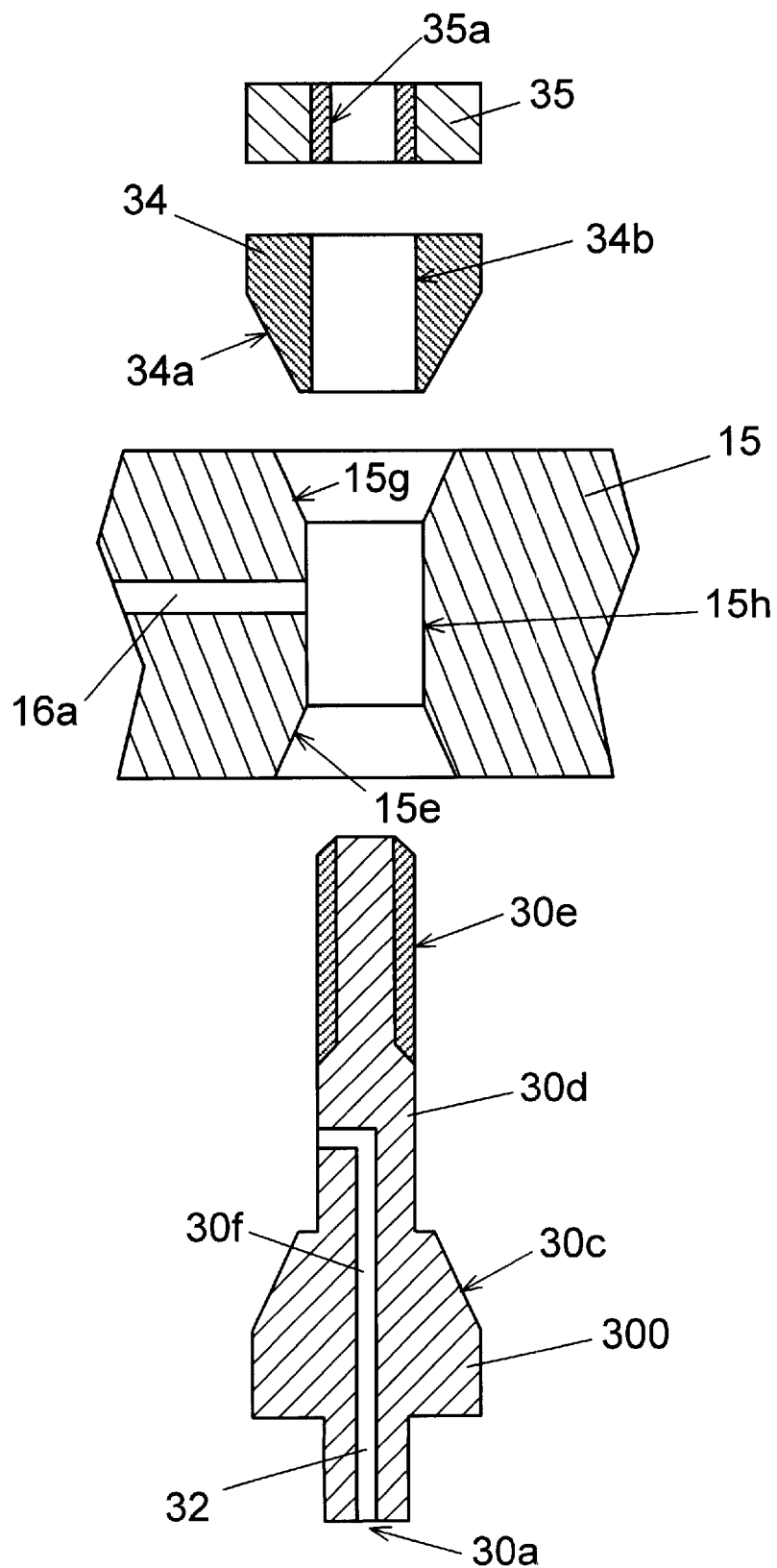
FIG. 6 and FIG. 7 are partial cross sectional views of a bonding tool of a bonding apparatus in accordance with a second exemplary embodiment of the present invention.
Figure 7:
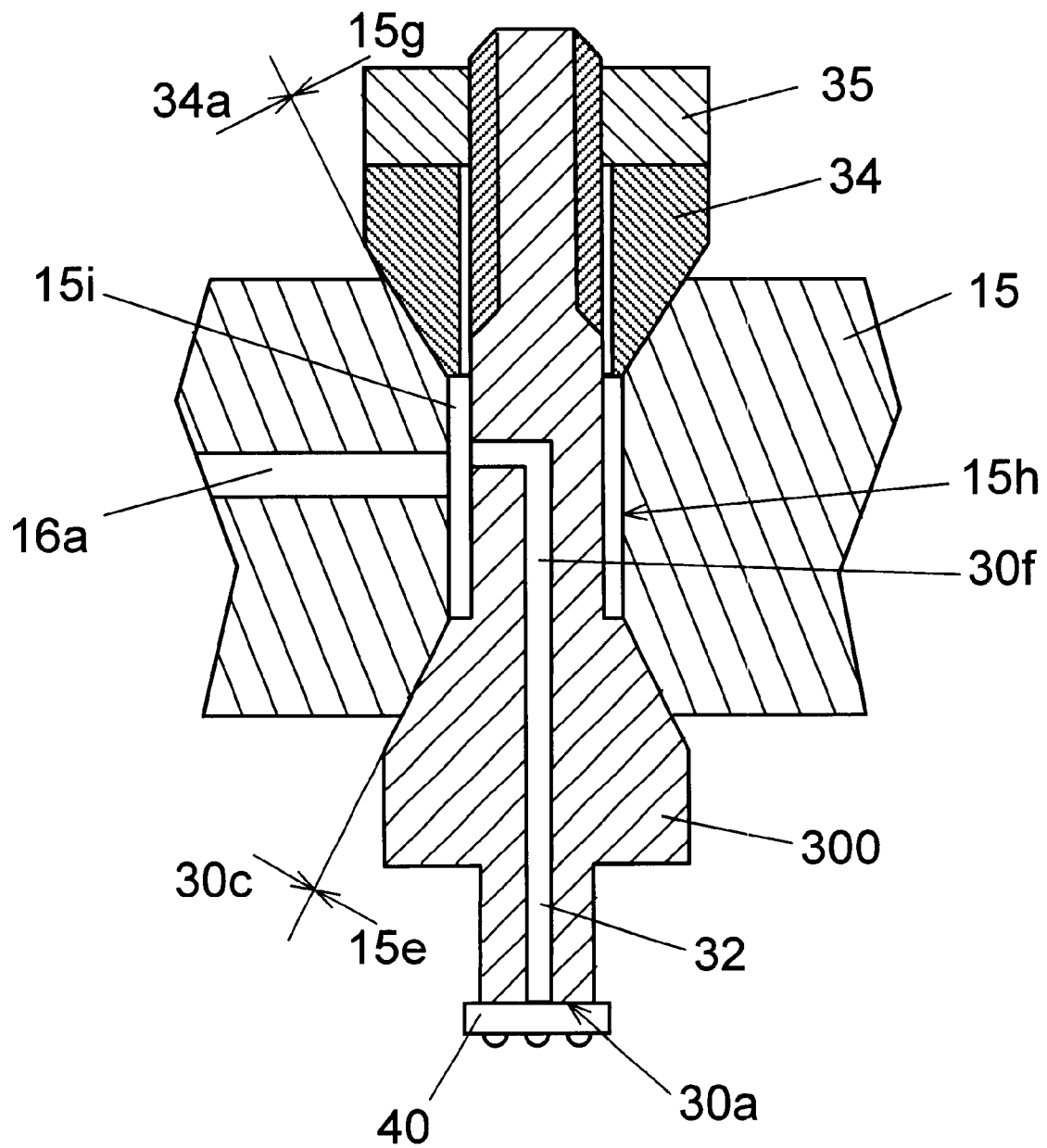

FIG. 6 and FIG. 7 are partial cross sectional views of a bonding tool of a bonding apparatus in accordance with the second exemplary embodiment of the present invention. In FIG. 6, horn 15 has through hole 15h and sucking hole 16a as same as in the first embodiment. At the upper and lower sections of through hole 15h, inner tapered sections 15g, 15e are respectively provided. In adhesion section 300 of the second embodiment, as same as the first embodiment, outer tapered section 30c-fitting to inner tapered section 15e of horn 15-is provided.

The second embodiment differs from the first one in the following points: (a) Outer tapered section 30c of adhesion section 300 has stick 30d extending upwardly, and outer screw section 30e is provided to the upper section of stick 30d; (b) Inside adhesion section 300, sucking hole 30f is formed, hole 30f communicating with adhesion hole 32 and open to a side wall of stick 30d; and (c) Engaging member 34 has outer tapered section 34a to be fit into inner tapered section 15g of horn 15, and stick 30d extends through inner hole 34b of engaging member 34.

When adhesion section 300 is going to fit into horn 15, as shown in FIG. 7, outer tapered section 30c of adhesion section 300 is fit into inner tapered section 15e of horn 15 and outer tapered section 34a of engaging member 34 is fit into inner tapered section 15g of horn 15. Then stick 30d is extended from the below through inner hole 34b of engaging member 34, and outer screw section 30e is mated with inner screw member 35a of inner screw section 35 and fastened. This mechanics allows adhesion section 300 to fit outer tapered section 30c into inner tapered section 15e of horn 15, so that adhesion section 300 is rigidly fit into horn 15.

In this fastening, outer tapered section 34a of engaging member 34 is fastened while it is fit into inner tapered section 15g of horn 15. Therefore, engaging member 34 and inner screw section 35 function as a coupling member to adhesion section 300 through hole 15h, and outer screw section 30e and inner screw section 35a function as a fastening means for coupling adhesion section 300 to engaging member 34.

When adhesion section 300 is fit into engaging member 34, the lower section of through hole 15h is sealed by bonding section 30a, and the upper section of through hole 15h is sealed by engaging member 34. Thus inner space 15i is formed inside hole 15h, as same as the first embodiment. Both the upper and lower ends of inner space 15i are sealed. When adhesion section 300 is fit into horn 15, sucking hole 30f of stick 30d communicates with adhesion hole 32 open to bonding section 30a, thus adhesion hole 32 communicates with inner space 15i. In other words, sucking hole 16a provided to horn 15 communicates with adhesion hole 32 via inner space 15i, as same as the first embodiment.

The bonding apparatus discussed in this second embodiment produces the same advantages as the first embodiment.

THIRD EXEMPLARY EMBODIMENT

Figure 8:
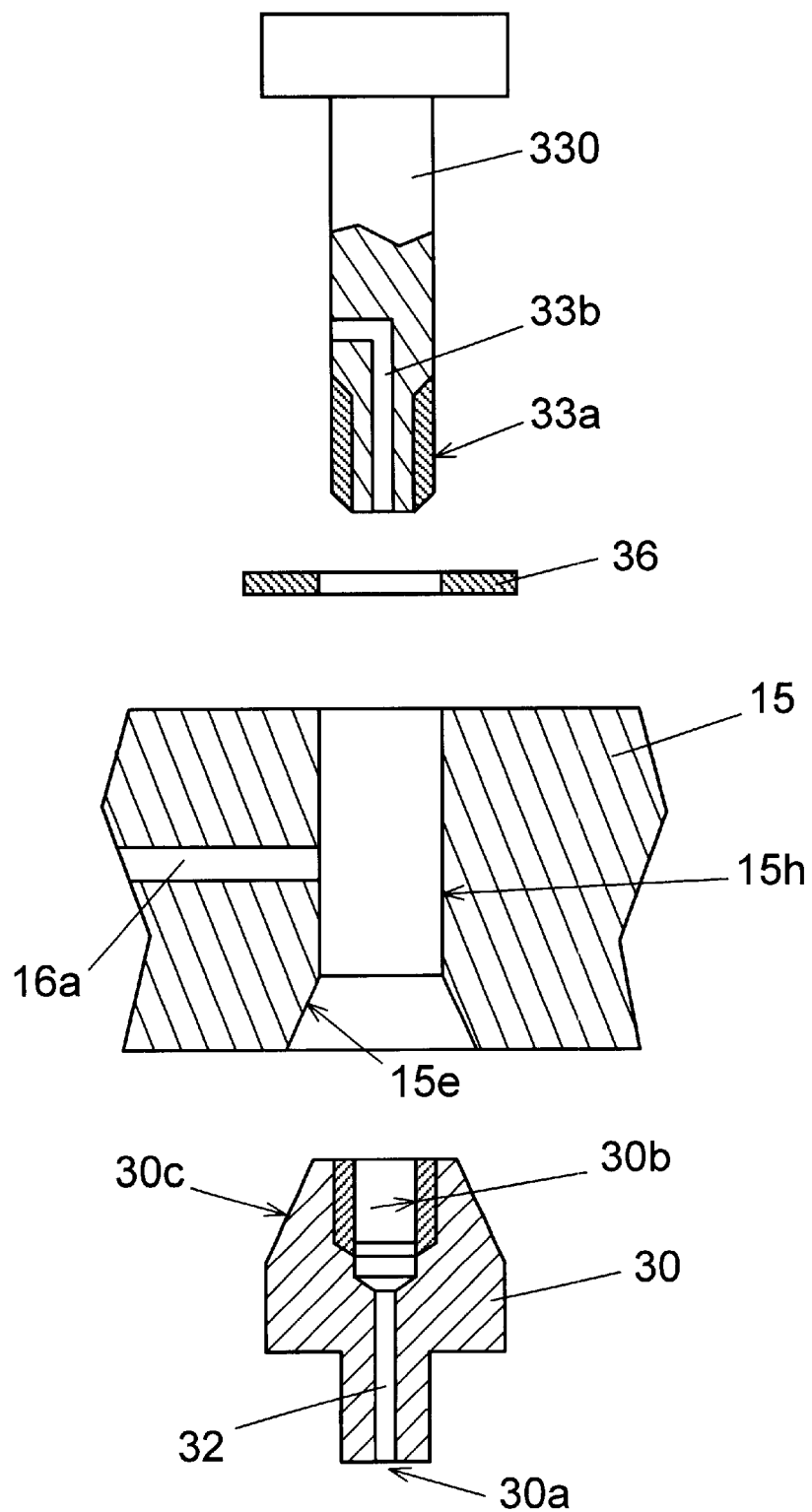
FIG. 8 and FIG. 9 are partial cross sectional views of a bonding tool of a bonding apparatus in accordance with a third exemplary embodiment of the present invention.
Figure 9:
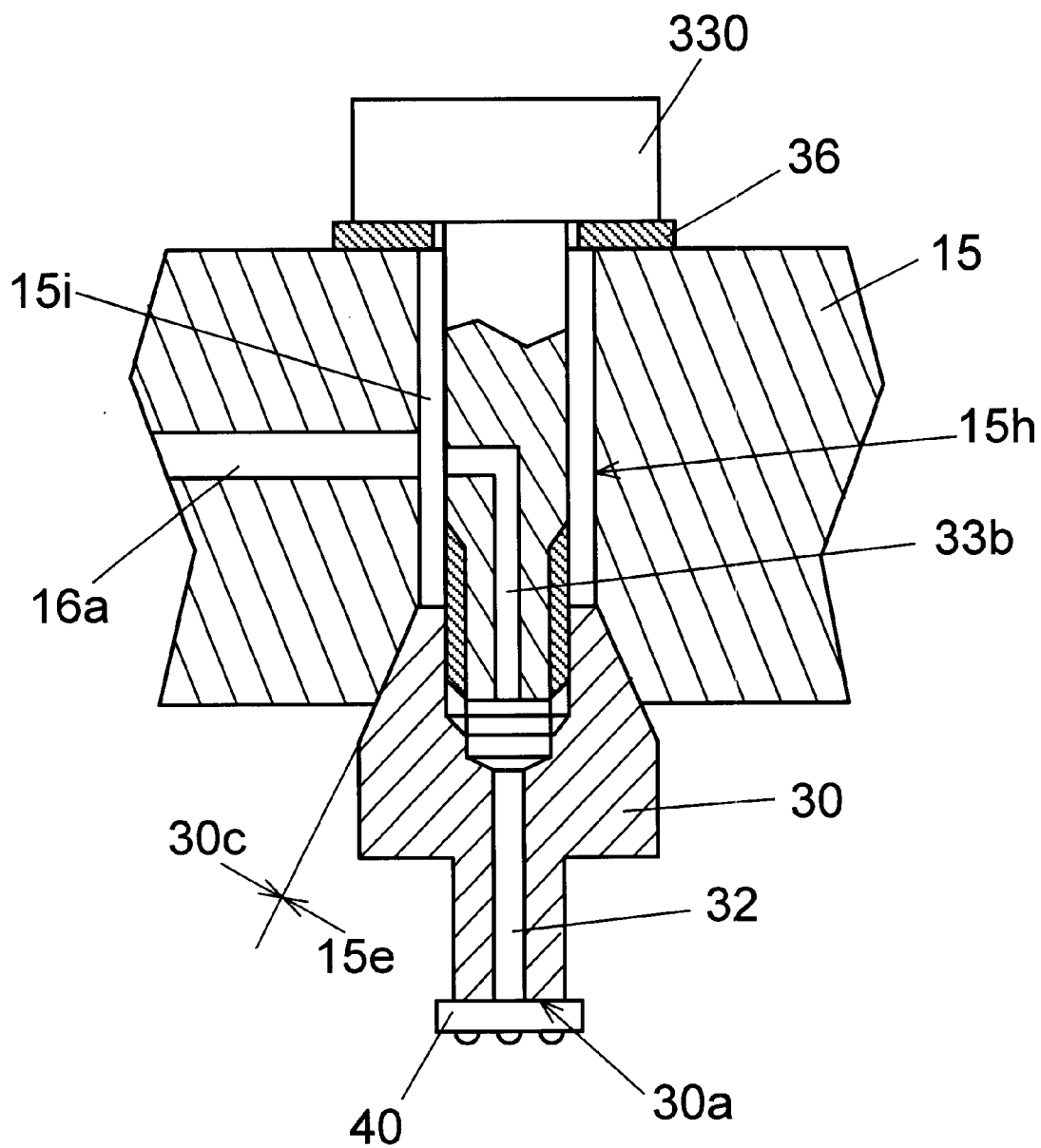

FIG. 8 and FIG. 9 are partial cross sectional views of a bonding tool of a bonding apparatus in accordance with the third exemplary embodiment of the present invention. In FIG. 8, horn 15 has through hole 15h and sucking hole 16a. Hole 15h has inner tapered section 15e at its lower section. Outer tapered section 30c of adhesion section 30, the same element used in the first embodiment, fits into inner tapered section 15e. Outer screw 330 extends through hole 15h. At the lower section of outer screw 330, outer screw section 33a to be mated with inner screw section 30b of adhesion section 30 is provided. Inside outer screw 330, sucking hole 33b-open to a side wall in the middle and communicating with the lower end-is formed.

When adhesion section 30 is fit into horn 15, as shown in FIG. 9, outer tapered section 30c of adhesion section 30 is fit into inner taper section 15e of horn 15, then outer screw 330 is extended through hole 15h via sealing member 36 from the above of horn 15. Outer screw section 33a is mated with inner screw section 30b of adhesion section 30 and fastened, so that outer tapered section 30c is fit into and fixed to inner tapered section 15e by outer screw 330. In this third embodiment, outer screw section 33a of outer screw 330 and inner screw section 30b of adhesion section 30 function as a fastening means, and outer screw 330, which is screwed in the upper section of hole 15h via sealing member 36, functions as a coupling member to adhesion section 30.

When adhesion section 30 is fit into horn 15, the lower section of through hole 15h is sealed by adhesion section 30, and the upper section of hole 15h is sealed by sealing member 36. Thus inner space 15i, of which upper and lower ends are sealed, is formed in hole 15h. Inner space 15i is vacuum sucked through sucking hole 16a. In other words, sucking hole 16a formed in horn 15 communicates with adhesion hole 32 via inner space 15i as same as the first and the second embodiments. The upper section of hole 15h can be sealed by the lower face of the head of screw 330 directly, then sealing member 36 can be omitted. The bonding apparatus discussed in this third embodiment can produce the same advantages as the first embodiment.

FOURTH EXEMPLARY EMBODIMENT

Figure 10:
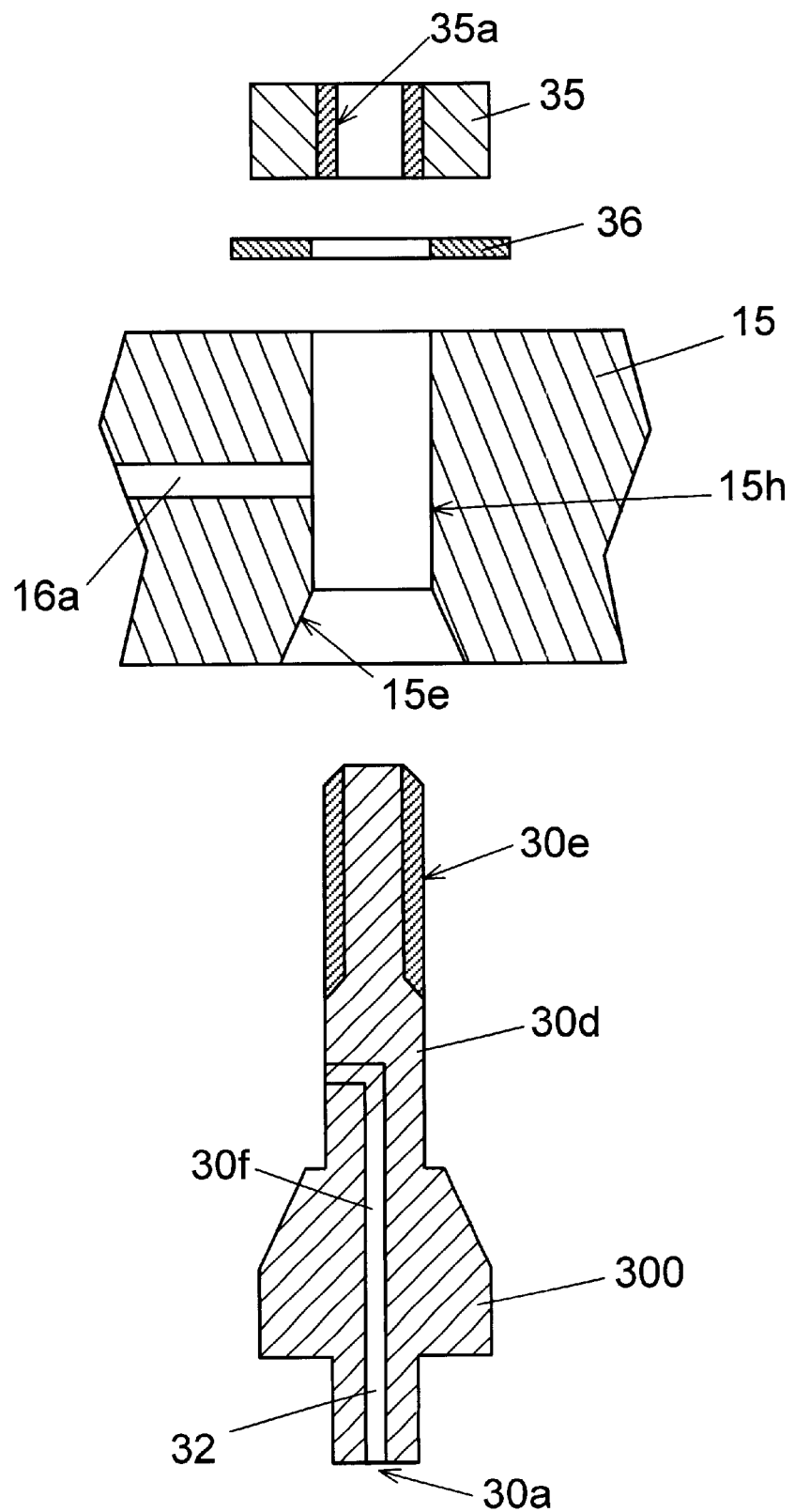
FIG. 10 and FIG. 11 are partial cross sectional views of a bonding tool of a bonding apparatus in accordance with a fourth exemplary embodiment of the present invention.
Figure 11:
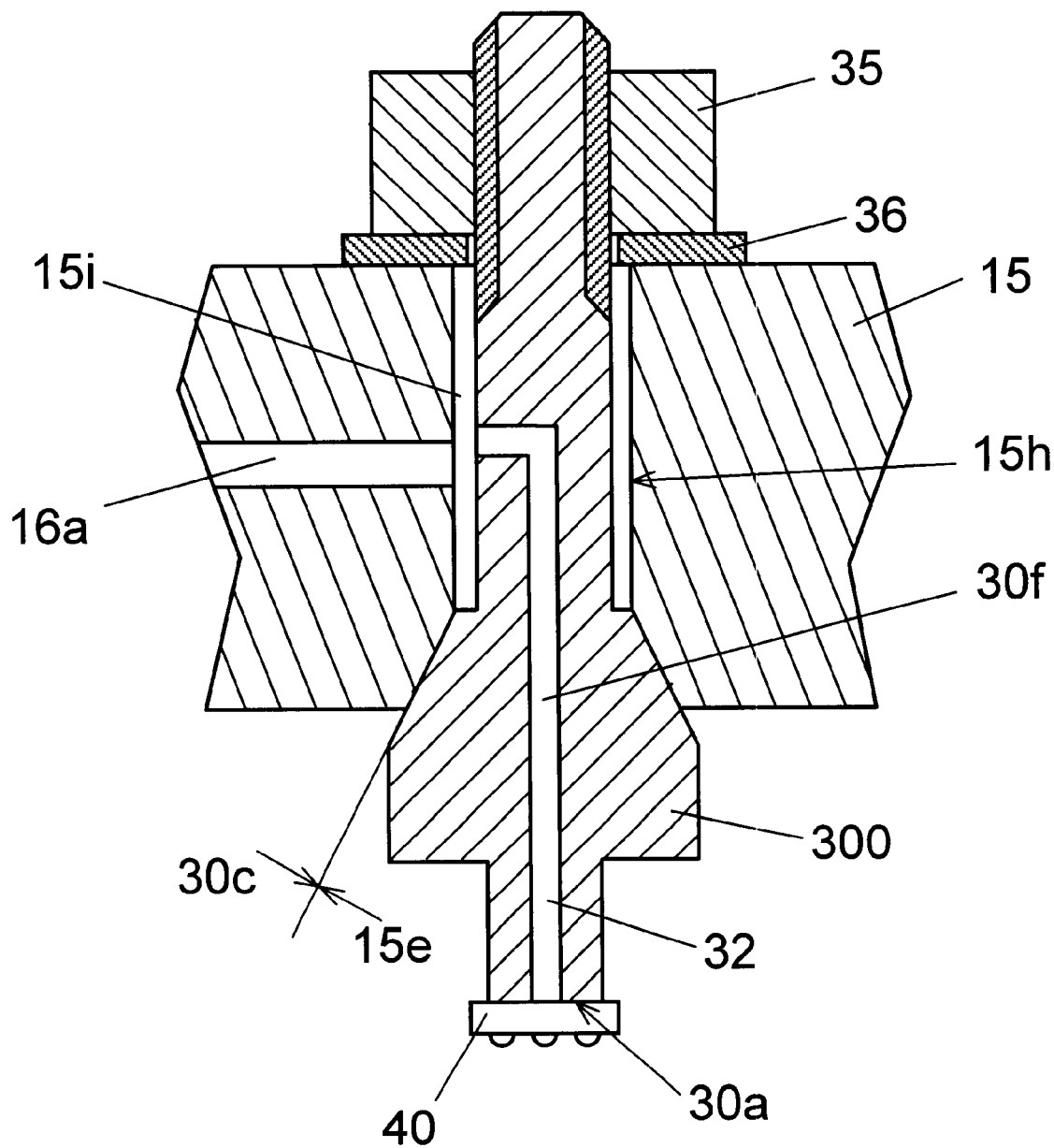

FIG. 10 and FIG. 11 are partial cross sectional views of a bonding tool of a bonding apparatus in accordance with the fourth exemplary embodiment of the present invention. In FIG. 10, horn 15 has through hole 15h and sucking hole 16a as same as the first embodiment. The lower section of hole 15h has inner tapered section 15e. Adhesion section 300 is the same as used in the second embodiment. When adhesion section 300 is fit into horn 15, as shown in FIG. 11, stick 30d of adhesion section 300 is extended through hole 15h upwardly from the bottom, and outer tapered section 30c is fit into inner tapered section 15e of horn 15.

Outer screw section 30e is thrust through horn 15 upwardly and mated with inner screw section 35a of inner screw 35 via sealing member 36, and is tightened. Therefore adhesion section 300 is rigidly fit into horn 15 because outer tapered section 30c is urged and fit to inner tapered section 15e. Thus outer screw section 30e and inner screw section 35a function as a fastening means, and sealing member 36 and inner screw 35 function as a coupling member to bonding section 30a.

When adhesion section 300 is fit into horn 15, as same as the first through the third embodiments, inner space 15i, of which both ends are sealed, is formed in through hole 15h. Sucking hole 16a formed in horn 15 communicates with adhesion hole 32 via inner space 15i. Inner screw 35 can seal the upper section of hole 15h, then sealing member 36 can be omitted. The bonding apparatus discussed in this fourth embodiment can produce the same advantages as the first embodiment.

As discussed above, according to the present invention, the bonding tool described in the previous embodiments retains component 40, and adhesion section 30, 300, functioning as the urging terminal for transmitting vibration and load to component 40, is detachable from horn 15. In this bonding tool, adhesion hole 32 communicates with sucking hole 16a via inner space 15i formed in horn 15. Thus bonding section 30a allows adhesion hole 32 to communicate with the source of vacuum suction without loosing replaceability in case of being damaged or worn out.

In the respective embodiments, the height and width of horn 15 taper down toward the center; however, other shapes, e.g., a rectangular horn can effect the same advantages.

It is not limited to the bonding tool of the two-points-supporting structure as discussed in the embodiments, but the present invention can be applied to a bonding tool of cantilever structure (single-point-supporting structure.)

In an exemplary embodiment of the present invention, a through hole is provided at a place corresponding to an antinode of the standing wave of a horn and orthogonal to the longitudinal direction of the horn. The upper and lower sections of the through hole are sealed by an urging terminal (adhesion section) and a coupling member, thereby forming an inner space. An adhesion hole open to a bonding section of the urging terminal communicates with a sucking hole formed in the horn via this inner space. Thus a vacuum adhesion system can be formed in a simple structure without loosing replaceability of the urging terminal.

In the embodiments described above, outer screw 33 and adhesion section 30 have been described as separate pieces. It is understood, however, that adhesion section 30 can be deleted if outer screw 33 extends below horn 15 and is appropriately sealed and configured for transmitting suction directly to component 40.

What is claimed is:

1. A bonding apparatus for bonding a component, comprising:
  a bonding tool including;
    a horn having a suction passage;
    a vibrator for vibrating said horn; and
    an outer screw having a further suction passage and at least partially situated within said horn so that an inner space is defined 1) between said outer screw and said horn; and 2) at least one of above and below said suction passage, so that suction supplied by a source of suction flows through said suction passage, said further suction passage and said inner space for picking up said component; and
  an urging unit for urging said bonding tool towards said component.

2. The bonding apparatus according to claim 1, wherein said outer screw makes contact with said component so that suction flowing through said further suction passage picks up said component.

3. The bonding apparatus according to claim 1, further comprising an adhesion section coupled to said outer screw, said adhesion section including an adhesion suction passage through which suction flows to said further suction passage wherein said adhesion section makes contact with said component so that suction flowing through said adhesion suction passage picks up said component.

4. A bonding apparatus comprising:
  (a) a bonding tool including:
    (a-1) a vibrator;
    (a-2) a horn having a suction passage, being given vibration produced by said vibrator and being provided with a through hole, the through hole being orthogonal to a longitudinal direction of said horn;
    (a-3) an outer screw;
    (a-4) an urging terminal mounted to said horn by said outer screw so that a first end of the through hole is sealed by said urging terminal, having a bonding section brought into contact with a component at a tip thereof, and having an adhesion hole being open to the bonding section and communicating with an inner space which is formed by sealing a second end and the first end of the through hole;

an urging unit for urging said bonding tool against said component;

wherein the component is bonded to a surface of a substrate while the inner space is subject to vacuum-suction via the suction passage and the component is urged and given vibration.

5. The bonding apparatus of claim 4, further comprising: (a-5) a coupling member mounted to said horn so that the second end of the through hole is sealed, being coupled to said urging terminal by said outer screw via the through hole.

6. The bonding apparatus of claim 4, wherein the bonding tool includes an inner screw section provided to said urging terminal, and said outer screw having an outer screw section for mating with the inner screw section.

7. The bonding apparatus of claim 4, wherein the bonding tool includes an inner screw section provided to said urging terminal and an outer screw section for mating with the inner screw section, and the coupling means includes an engaging member having an outer tapered section for fitting into an inner tapered section formed in the through hole and through the engaging member said outer screw extends.

8. The bonding apparatus of claim 4, wherein the bonding tool includes an outer screw section provided to said urging terminal and an inner screw in which an inner screw section for mating with the outer screw section is formed.

9. The bonding apparatus of claim 4, wherein the bonding tool includes an outer screw section provided to said urging terminal and an inner screw in which an inner screw section for mating with the outer screw section is formed, and the coupling means includes an engaging member having an outer tapered section for fitting into an inner tapered section formed in the through hole and through the engaging member the outer screw extends.

10. The bonding apparatus of claim 4, wherein the bonding tool comprises a pair of an inner screw section and an outer screw section, and the first end and the second end of the through hole are sealed with said urging terminal and the coupling member by tightening these screw sections.

11. A bonding tool for bonding a component, comprising:

a horn having a suction passage;

a vibrator for vibrating said horn; and an outer screw having a further suction passage and at least partially situated within said horn so that an inner space is defined 1) between said outer screw and said horn; and 2) at least one of above and below said suction passage, so that suction supplied by said source of suction flows through said suction passage, said further suction passage and said inner space for picking up said component.

12. The bonding tool according to claim 11, wherein said outer screw makes contact with said component so that suction flowing through said further suction passage picks up said component.

13. The bonding tool according to claim 11, further comprising an adhesion section coupled to said outer screw, said adhesion section including an adhesion suction passage through which suction flows to said further suction passage wherein said adhesion section makes contact with said component so that suction flowing through said adhesion suction passage picks up said component.

14. A bonding tool comprising:

(a) a vibrator;

(b) a horn having a suction passage, being given vibration produced by said vibrator and being provided with a through hole, the through hole being orthogonal to a longitudinal direction of said horn;

(c) an outer screw;

(d) an urging terminal mounted to said horn by said outer screw so that a first end of the through hole is sealed by said urging terminal, having a bonding section brought into contact with a component-at component at a tip thereof, and having an adhesion hole being open to the bonding section and communicating with an inner space which is formed by sealing a second end and the first end of the through hole;

wherein the component is bonded to a surface of a substrate while the inner space is vacuum-sucked via the suction passage and the component is urged and given vibration.

15. The bonding tool of claim 14, further comprising: (e) a coupling member mounted to said horn so that the second end of the through hole is sealed, being coupled to said urging terminal by said outer screw via the through hole.

16. The bonding tool of claim 14, wherein the bonding tool includes an inner screw section provided to said urging terminal, and said outer screw having an outer screw section for mating with the inner screw section.

17. The bonding tool of claim 14, wherein the bonding tool includes an inner screw section provided to said urging terminal and an outer screw section for mating with the inner screw section, and the coupling means includes an engaging member having an outer tapered section for fitting into an inner tapered section formed in the through hole and through the engaging member said outer screw extends.

18. The bonding tool of claim 14, wherein the bonding tool includes an outer screw section provided to said urging terminal and an inner screw in which an inner screw section for mating with the outer screw section is formed.

19. The bonding tool of claim 14, wherein the bonding tool includes an outer screw section provided to said urging terminal and an inner screw in which an inner screw section for mating with the outer screw section is formed, and the coupling means includes an engaging member having an outer tapered section for fitting into an inner tapered section formed in the through hole and through the engaging member the outer screw extends.

20. The bonding tool of claim 14, wherein the bonding tool comprises a pair of an inner screw section and an outer screw section, and the first end and the second end of the through hole are sealed with said urging terminal and the coupling member by tightening these screw sections.

* * * * *

UNITED STATES PATENT AND TRADEMARK OFFICE
CERTIFICATE OF CORRECTION

PATENT NO.    : 6,497,354 B2
DATED         : December 24, 2002
INVENTOR(S)   : Takahashi et al.

It is certified that error appears in the above-identified patent and that said Letters Patent is hereby corrected as shown below:

<u>Column 10,</u>
Line 16, delete "-at component".

Signed and Sealed this

Twelfth Day of August, 2003

JAMES E. ROGAN
*Director of the United States Patent and Trademark Office*